United States Patent
Moizumi (10) Patent No.: US 12,468,229 B2
(45) Date of Patent: Nov. 11, 2025

(54) EXPOSURE METHOD, EXPOSURE APPARATUS, AND METHOD FOR MANUFACTURING ARTICLE

(71) Applicant: CANON KABUSHIKI KAISHA, Tokyo (JP)

(72) Inventor: Jun Moizumi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 18/496,547

(22) Filed: Oct. 27, 2023

(65) Prior Publication Data
US 2024/0142879 A1 May 2, 2024

(30) Foreign Application Priority Data
Oct. 31, 2022 (JP) .................. 2022-174673

(51) Int. Cl.
*G03F 7/00* (2006.01)

(52) U.S. Cl.
CPC .............. *G03F 7/70266* (2013.01)

(58) Field of Classification Search
CPC .......... G03F 7/70641; G03F 7/706845; G03F 7/70258; G03F 7/70891; G03F 7/705; G03F 7/20; G03F 7/70483; G03F 7/706; G03F 7/70504; G03F 7/70266; G03B 27/52; H01L 21/0274
See application file for complete search history.

(56) References Cited

U.S. PATENT DOCUMENTS

| | | | |
|---|---|---|---|
| 5,801,815 A * | 9/1998 | Takahashi | G03F 7/706 355/53 |
| 7,102,731 B2 * | 9/2006 | Hirukawa | G03F 7/706 355/53 |
| 9,482,967 B2 * | 11/2016 | Van De Kerkhof | G03F 7/706 |
| 10,394,134 B2 * | 8/2019 | Koizumi | G03F 7/70258 |
| 10,545,413 B2 * | 1/2020 | Takeshita | G03F 7/70133 |
| 2006/0008716 A1 | 1/2006 | Jeunink | |
| 2008/0246933 A1 | 10/2008 | Uchikawa | |

FOREIGN PATENT DOCUMENTS

| | | |
|---|---|---|
| JP | 2014103343 A | 6/2014 |
| KR | 20050121728 A | 12/2005 |
| KR | 20060049927 A | 5/2006 |
| KR | 20060128898 A | 12/2006 |
| KR | 20190015136 A | 2/2019 |
| KR | 20220087364 A | 6/2022 |

\* cited by examiner

*Primary Examiner* — Hung V Nguyen
(74) *Attorney, Agent, or Firm* — Canon U.S.A., Inc. IP Division (57) ABSTRACT

An exposure method includes performing exposure processing via a projection optical system between a start and an end of the exposure processing on a plurality of substrates included in a lot as exposure, predicting a change in an optical characteristic of the projection optical system during the exposure based on an exposure processing condition of the exposure, determining whether the optical characteristic exceeds a predetermined range during the exposure based on a predicted result, and in a case where the optical characteristic is determined to exceed the predetermined range during the exposure, adjusting the optical characteristic before the optical characteristic exceeds the predetermined range, wherein at least one or more of the plurality of substrates is/are exposed after the adjusting.

17 Claims, 9 Drawing Sheets

EXPOSURE METHOD, EXPOSURE APPARATUS, AND METHOD FOR MANUFACTURING ARTICLE

BACKGROUND

Field

The present disclosure generally relates to exposure and, more particularly, to an exposure method, an exposure apparatus, and a method for manufacturing an article.

Description of the Related Art

A manufacturing process of semiconductor devices or liquid crystal display devices uses an exposure apparatus that illuminates a master by an illumination optical system and projects a pattern of the master onto a substrate via a projection optical system to expose the substrate. If the projection optical system absorbs exposure light and generates heat, aberration occurs. The aberration affects a result of exposure processing.

Japanese Patent Application Laid-Open No. 2014-103343 discusses a method for predicting aberration due to exposure processing and determining whether to perform the next exposure processing based on a result of prediction.

In view of productivity, in a case where aberration occurs, it is desirable to correct the aberration to perform the next exposure processing promptly. Moreover, aberration can change even while the exposure processing is being performed on one lot. If aberration increases in the middle of the lot, resolution performance can drop and fail to satisfy desired quality.

SUMMARY

The present disclosure is generally directed to providing an exposure method capable of performing exposure processing with a reduced effect of aberration, as well as an exposure apparatus and a method for manufacturing an article.

According to some embodiments, an exposure method includes performing exposure processing via a projection optical system between a start and an end of the exposure processing on a plurality of substrates included in a lot as exposure, predicting a change in an optical characteristic of the projection optical system during the exposure based on an exposure processing condition of the exposure, determining whether the optical characteristic exceeds a predetermined range during the exposure based on a predicted result, and in a case where the optical characteristic is determined to exceed the predetermined range during the exposure, adjusting the optical characteristic before the optical characteristic exceeds the predetermined range, wherein at least one or more of the plurality of substrates is/are exposed after the adjusting.

Further features of the present disclosure will become apparent from the following description of exemplary embodiments with reference to the attached drawings.

DESCRIPTION OF THE EMBODIMENTS

Exemplary embodiments of the present disclosure will be described below with reference to the drawings. The following exemplary embodiments are not intended to limit the disclosure set forth in the claims. While the exemplary embodiments describe a plurality of features, not all the features are necessarily essential to the disclosure, and the features may be combined in any given manner. In the drawings, the same or similar components are denoted by the same reference numerals. A redundant description thereof will be omitted.

In this specification and the drawings, directions are basically expressed using an XYZ coordinate system with mutually orthogonal axes, where the vertical direction is a Z-axis and a horizontal plane perpendicular to the vertical direction is an XY plane. If an XYZ coordinate system is illustrated in a diagram, that coordinate system is given priority.

A specific configuration of each of the exemplary embodiments will be described below.

Figure 1:
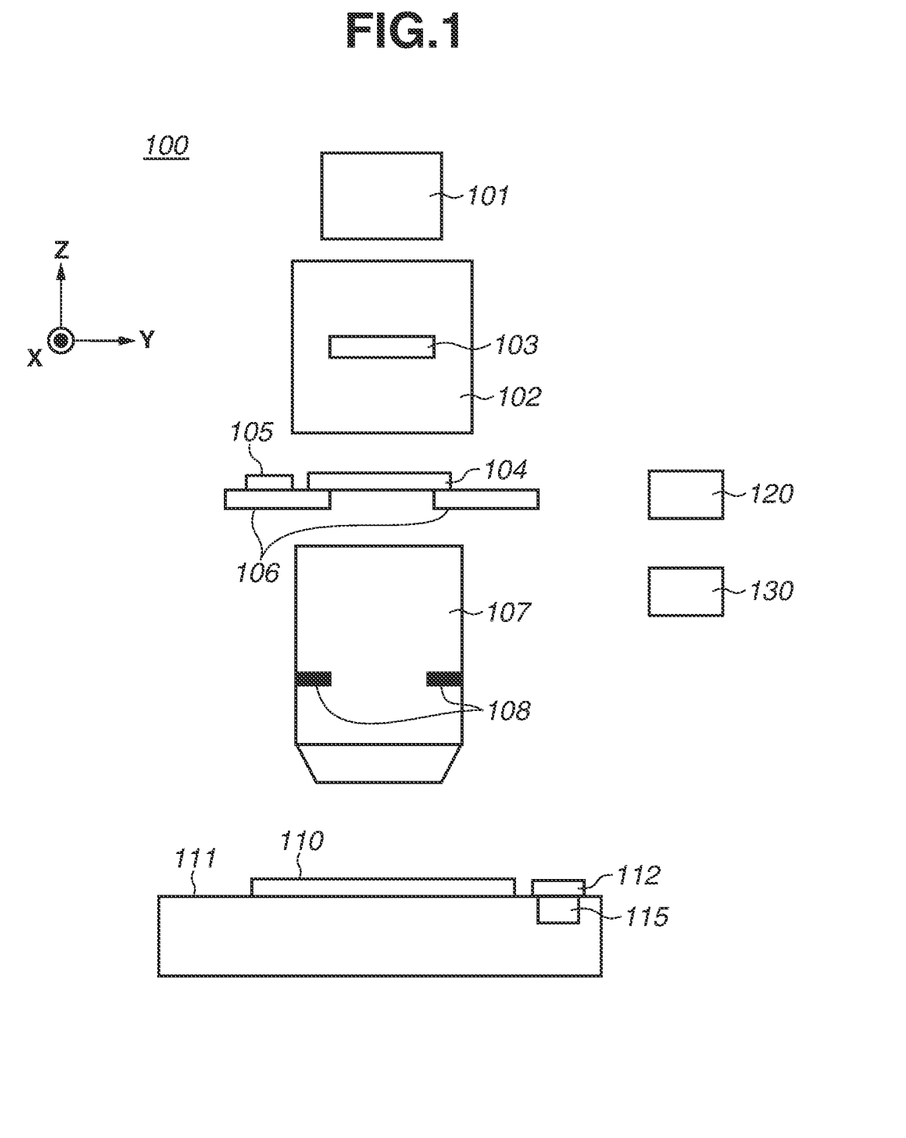
FIG. 1 is a schematic diagram illustrating a configuration of an exposure apparatus according to a first exemplary embodiment.

FIG. 1 is a schematic diagram illustrating a configuration of an exposure apparatus 100 according to a first exemplary embodiment. Light emitted from a light source 101 is incident on an illumination optical system 102. A diffraction optical element 103 forms a light intensity distribution (hereinafter, also referred to as an effective light source distribution) on a pupil plane of the illumination optical system 102, and a reticle 104 is irradiated with the resulting light. The reticle 104 is a master formed of, e.g., quartz glass having a surface on which a pattern to be transferred (for example, circuit pattern) is formed with chromium. The light incident on the pattern drawn on the reticle 104 is diffracted by the reticle 104 and enters a projection optical system 107. The light is adjusted in amount by an aperture stop 108 disposed in the projection optical system 107 and reaches a substrate 110, whereby the pattern on the reticle 104 is projected in a reduced size. Here, the substrate 110 is formed of, e.g., a monocrystalline silicon having a surface on which a photosensitive material (resist) is applied. A control unit 120 has a processor, circuitry, or combinations thereof and can be configured as a controller to control one or more units or components in the exposure apparatus 100. A storage unit 130 stores information obtained from the control unit 120.

The reticle 104 is held on a reticle stage 106. The reticle stage 106 is driven to scan in a +Y direction. A substrate stage 111 holding the substrate 110 is driven to scan in a −Y direction. After an exposure of a shot area ends, the stages are step-driven to expose the next shot area.

A reticle reference plate 105 different from the reticle 104 is disposed on the reticle stage 106. The reticle reference plate 105 is provided with a reticle-side mark for measuring an aerial image. The reticle-side mark is a pattern of cyclically arranged lines and spaces. A detection plate 112 is further disposed on the substrate stage 111. The detection plate 112 is provided with a substrate-side mark (not illustrated) for measuring an aerial image. The substrate-side mark is a pattern of lines and spaces arranged in the same cycle as that of the reticle-side mark. A photodetector 115 is located under the detection plate 112.

Light-blocking portions of the line-and-space patterns on the reticle-side and substrate-side marks are formed of chromium, for example. Light-transmitting portions thereof are formed of glass. The reticle stage 106 is driven in the Y direction so that the reticle-side mark on the reticle reference plate 105 is irradiated with the light emitted from the light source 101 via the illumination optical system 102. The light having passed through the reticle-side mark on the reticle reference plate 105 reaches the substrate-side mark on the detection plate 112 via the projection optical system 107. The reached light passes through the substrate-side mark on the detection plate 112 and reaches the photodetector 115.

Next, aerial image measurement that is a measurement method for measuring astigmatism (optical characteristic) will be described.

The reticle reference plate 105 is irradiated with the light emitted from the light source 101 via the illumination optical system 102, whereby the reticle-side mark is projected in a reduced size onto the substrate-side mark via the projection optical system 107. If the substrate stage 111 is moved in a Z direction that is an optical axis direction in a state of reduced size projection, an image of the reticle-side mark projected in a reduced size matches the reference-side mark at a best focus position of the projection optical system 107. Here, the amount of light received by the photodetector 115 is maximized. As the substrate stage 111 moves away from the best focus position, the image of the reticle-side mark projected in a reduced size onto the substrate-side mark on the detection plate 112 decreases in contrast and blurs, and the amount of light received by the photodetector 115 drops.

Figure 2:
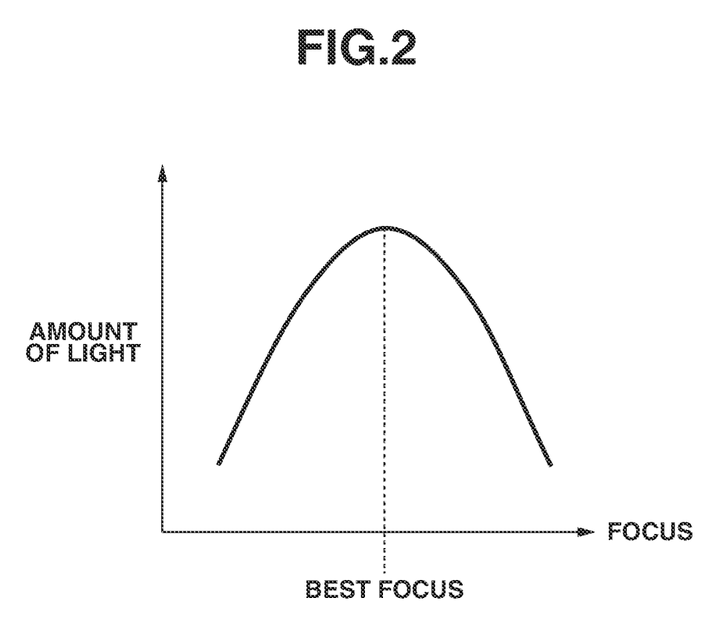
FIG. 2 is a chart illustrating a relationship between focus and the amount of light in driving a substrate stage in a Z direction.

FIG. 2 is a diagram illustrating a relationship between the focus and the amount of light when the substrate stage 111 is driven in the Z direction. FIG. 2 illustrates an example of a case where the substrate stage 111 is driven in the Z direction across the best focus position, with the reticle-side mark being projected in a reduced size onto the substrate-side mark. The horizontal axis indicates the focus, and the vertical axis indicates the amount of light detected by the photodetector 115. The illustrated relationship between the focus and the amount of light has a curved shape convex upward. The peak position of the curved shape is the best focus position. While, in the present exemplary embodiment, an example has been described where the best focus position is determined from a result of detection of the light having passed through the reticle-side mark and the substrate-side mark by the photodetector 115, the method for determining the best focus position is not limited to this example.

Figure 3:
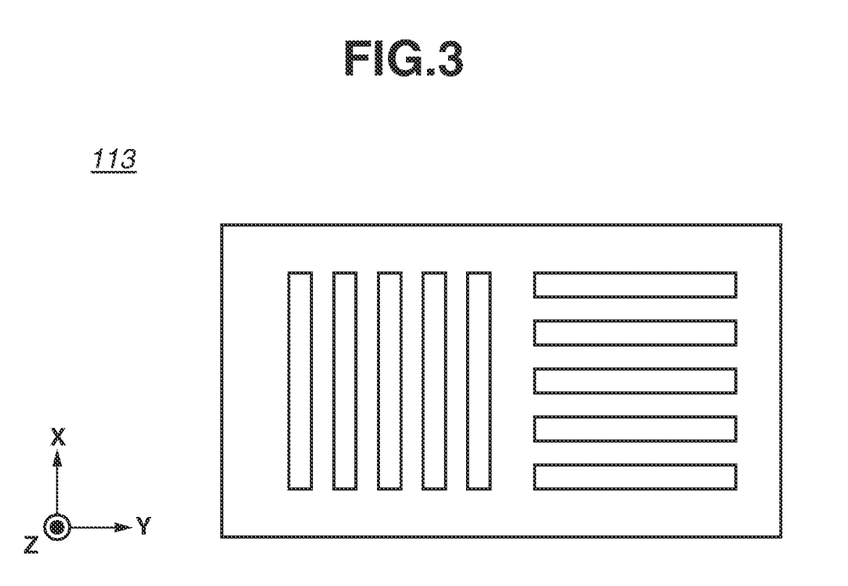
FIG. 3 is a schematic diagram illustrating a line-and-space pattern of a reticle-side mark.

FIG. 3 is a schematic diagram illustrating the line-and-space pattern of a reticle-side mark 113. The substrate-side mark has a similar configuration. The reticle-side mark 113 and the substrate-side mark each include X- and Y-direction line-and-space patterns for astigmatism measurement. With the X- and Y-direction line-and-space patterns of the reticle-side mark 113 being projected in a reduced size onto the substrate-side mark, the substrate stage 111 is driven in the Z direction over an area across (including) the best focus positions both in the X and Y directions. As a result, the relationship between the focus and the amount of light illustrated in FIG. 2 can be obtained of both the X- and Y-direction line-and-space patterns. Based on the obtained relationships between the focus and the amount of light of the X- and Y-direction line-and-space patterns, the best focus positions in the X and Y directions are determined from the respective positions where the amount of light is maximized (peak positions). Astigmatism can be determined by determining a difference between the best focus position in the X direction and the best focus position in the Y direction.

Figure 4:
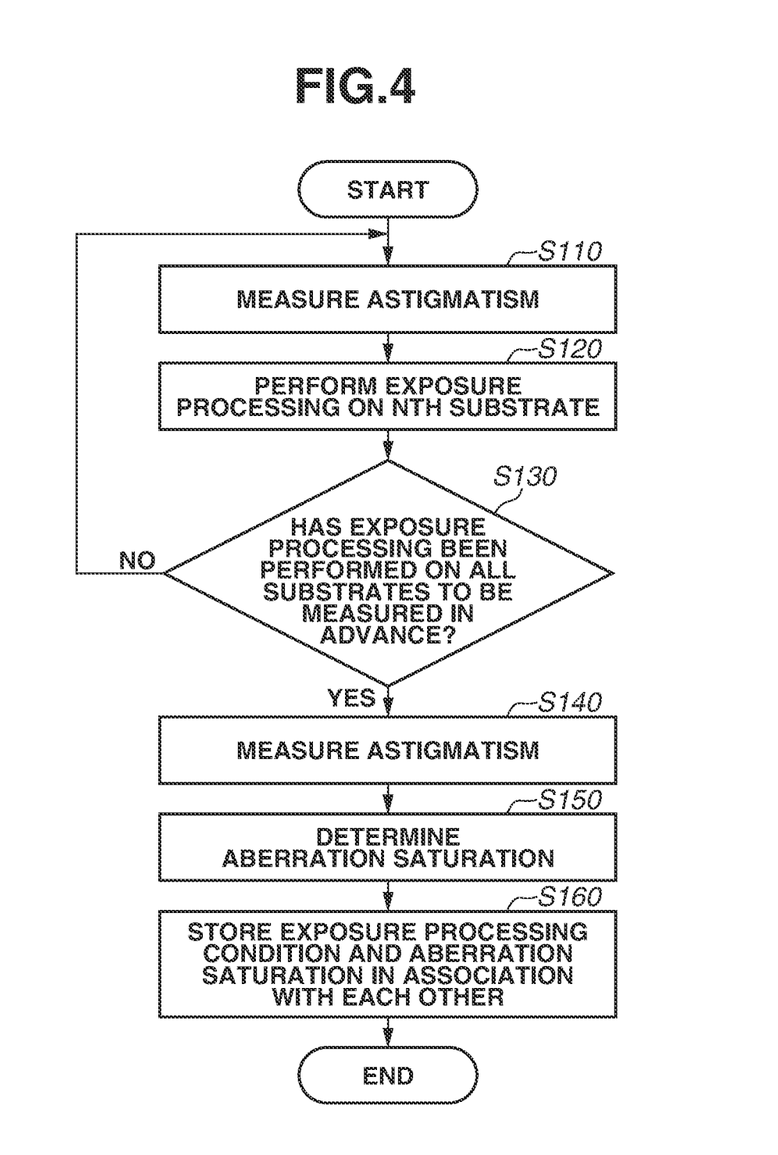
FIG. 4 is a flowchart for storing an aberration saturation to be used in prediction equations for predicting astigmatism according to the first exemplary embodiment.

FIG. 4 is a flowchart for storing an aberration saturation P (first coefficient) used in prediction equations (models) for predicting astigmatism according to the present exemplary embodiment. In the present exemplary embodiment, first information, or information including the aberration saturation P (first coefficient) for predicting a change in an optical characteristic during an exposure process where the exposure processing is performed, is obtained in advance.

In step S110, astigmatism is measured from the effective light source distribution for the exposure processing. In step S120, the exposure processing is performed on an Nth substrate on which the exposure processing has not been performed among substrates to be measured in advance. The substrates to be measured in advance refer to substrates to be used to determine the aberration saturation P. For example, the substrates to be measured in advance are substrates included in one lot. The aberration saturation P is a value specific to an exposure processing condition. In step S130, the control unit 120 determines whether the exposure processing has been performed on all the substrates to be measured in advance. If the exposure processing has not been performed on all the substrates to be measured in advance (NO in step S130), the processing returns to step S110. If the exposure processing has been performed on all the substrates to be measured in advance (YES in step S130), the processing proceeds to step S140. In step S140, the astigmatism is measured from the effective light source distribution for the exposure processing. In step S150, the control unit 120 determines the aberration saturation P to be used in the prediction equations. In step S160, the storage unit 130 stores the exposure processing condition and the aberration saturation P in association with each other, and the processing ends. In the present exemplary embodiment, an example has been described where all the substrates to be measured in advance (for example, 25 substrates included in a lot) are to be measured for the optical characteristic (astigmatism). However, if the amount of information obtained is sufficient, not all the substrates to be measured in advance need to be measured for the optical characteristic (astigmatism). For example, if, in step S130, the exposure processing is determined to have been performed on all the substrates to be measured in advance, the processing may skip step S140 and proceed to step S150.

The aberration saturation P to be used in the prediction equations for predicting astigmatism, which is determined in step S150, is obtained by fitting measurements of the astigmatism to prediction equations expressed by Eqs. (1), (2), and (3). An amount of astigmatism that occurs in actual exposure processing can be predicted based on the determined aberration saturation P, the prediction equations Eqs. (1), (2), and (3), and information (second information) about an initial value for predicting a change in the optical characteristic (astigmatism). For example, the second information may be information obtained by measuring the optical characteristic, or a target value of adjustment of the optical characteristic in an adjustment process. Alternatively, the second information may be a value obtained based on the target value of adjustment of the optical characteristic in the adjustment process and an amount of change in the optical characteristic predicted to occur after the adjustment process. The prediction is made, for example, on a change (amount of occurrence) in the astigmatism (optical characteristic) during the exposure processing when the exposure processing is performed on a plurality of substrates included in a lot.

$$\Phi_N = \Phi_{1N} + \Phi_{2N} + \Phi_{3N}, \qquad \text{Eq. (1)}$$

$$\Phi_{mN} = P_m \times \alpha_N - (P_m \times \alpha_N - \Phi_{mN-1}) \times \exp\left(-\frac{T_N}{K_m}\right), \text{ and} \qquad \text{Eq. (2)}$$

$$\alpha_N = \frac{R \times D \times A \times Num_N}{T_N}. \qquad \text{Eq. (3)}$$

Here, $\Phi$ indicates a predicted amount of occurrence of modeled astigmatism, and the suffix N indicates the timing of measurement of the astigmatism. In the present exemplary embodiment, three time constants (K) are used. The suffix m indicates a model number, where m=1 refers to a long-term time constant model, m=2 refers to a medium-term time constant model, and m=3 refers to a short-term time constant model. While, in the present exemplary embodiment, three aberration saturations P are determined using the three time constant models, the number of time constant models may be two or more. $\alpha$ indicates an exposure load, which changes in value depending on an exposure condition. As expressed by Eq. (3), the exposure load $\alpha$ can be determined from a reticle transmittance R, an amount of exposure D, a shot size A, the number of shots Num between one astigmatism measurement and another astigmatism measurement, and time T between one astigmatism measurement and another astigmatism measurement. The exposure load $\alpha$ may be calculated using other parameters, such as a resist reflectance. In other words, in the present exemplary embodiment, a change in the optical characteristic during the exposure processing of a plurality of substrates (plurality of substrates included in a lot) is predicted based on the exposure processing condition.

Figure 5:
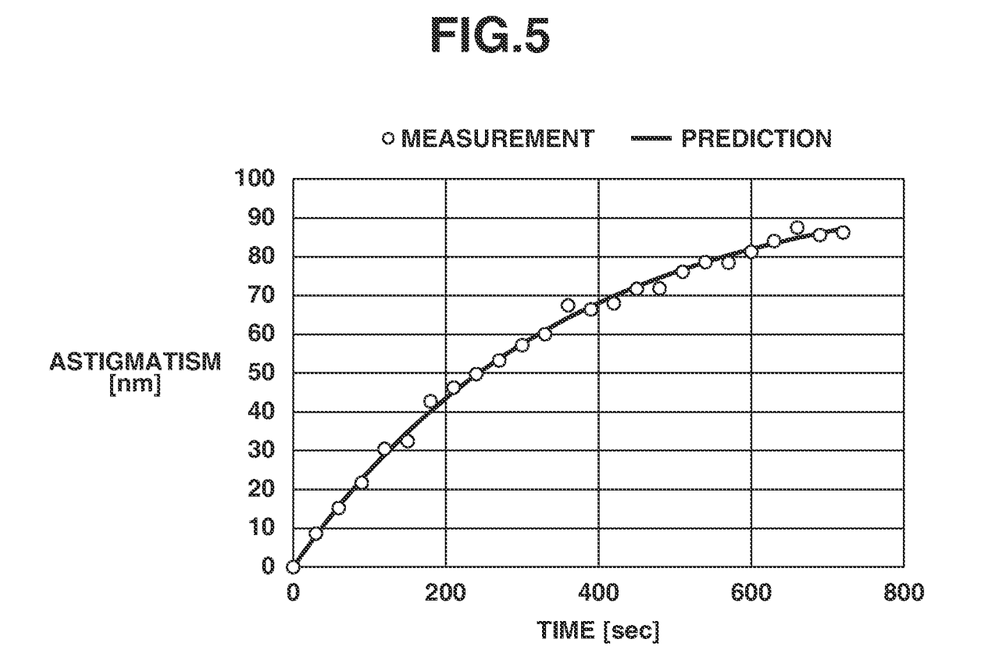
FIG. 5 illustrates a result of aberration prediction according to the first exemplary embodiment.

FIG. 5 illustrates results of aberration prediction according to the present exemplary embodiment. The horizontal axis indicates time, and the vertical axis indicates the amount of astigmatism. The white dots represent the measurements of the astigmatism obtained in steps S110 and S140, and the solid line represents the aberration predicted to occur using the prediction equations. The control unit 120 measures the astigmatism in steps S110 and S140 under a feasible exposure processing condition in advance, and determines the aberration saturation P from the measurements and Eqs. (1), (2), and (3). Then, the storage unit 130 stores the aberration saturation P determined by the control unit 120 and the exposure processing condition in association with each other. When the control unit 120 performs exposure processing under the same exposure processing condition as that stored in the storage unit 130, the control unit 120 predicts the amount of aberration that occurs during the exposure processing based on the information stored in the storage unit 130. Specifically, the control unit 120 predicts the amount of aberration that occurs based on the aberration saturation P stored in the storage unit 130 in association with the exposure processing condition, Eqs. (1), (2), and (3), and the second information, which is the information about the initial value to be used for the prediction of the astigmatism.

Figure 6A:
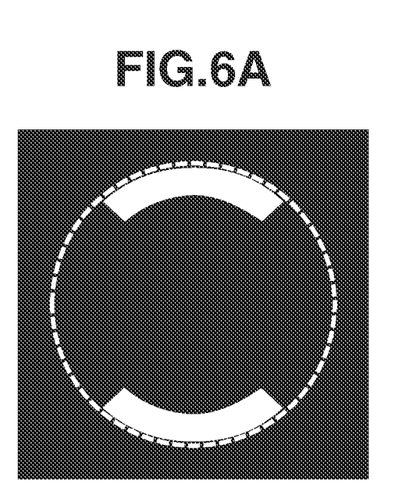
FIGS. 6A and 6B illustrate examples of a light intensity distribution on a pupil plane of an illumination optical system used for dummy irradiation according to the first exemplary embodiment.
Figure 6B:
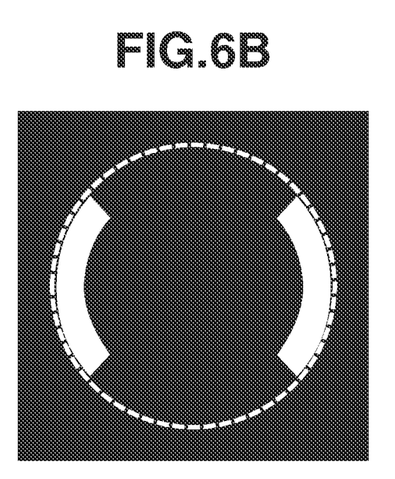

Next, dummy irradiation for correcting astigmatism will be described. FIGS. 6A and 6B illustrate examples of a light intensity distribution (effective light source distribution) on the pupil plane of the illumination optical system 102 for use in the dummy irradiation according to the present exemplary embodiment. The light emitted from the light source 101 is shaped into an effective light source distribution illustrated in FIG. 6A or 6B by the diffraction optical element 103 in the illumination optical system 102. The dotted lines in FIGS. 6A and 6B represent σ=1. The white areas have light intensity.

The light of the effective light source distribution that has been shaped is made to enter the projection optical system 107 via the illumination optical system 102 without passing through the reticle 104. Here, the aperture stop 108 located near the pupil of the projection optical system 107 is shut so that the light entering the projection optical system 107 illuminates the aperture stop 108 and does not reach the substrate 110. The incidence of the light having entered the projection optical system 107 on a group of lenses constituting the projection optical system 107 heats the lenses due to absorption by a glass material of the lenses and absorption by antireflection films, and the refractive indices of the lenses change to cause wavefront aberration. For example, if the effective light source distribution illustrated in FIG. 6A is formed by the diffraction optical element 103 and made to enter the projection optical system 107, the projection optical system 107 causes wavefront aberration with a distribution corresponding to the effective light source distribution. In other words, the sign of the astigmatism can be controlled by switching the diffraction optical element 103 to select the effective light source distribution so that the astigmatism has a desired sign, and performing dummy irradiation. Moreover, a desired amount of astigmatism can be obtained by adjusting the duration of the dummy irradiation. While, in the present exemplary embodiment, an example is described where the dummy irradiation is performed using 2θ components of wavefront aberration, 3θ or 4θ components may be used without any particular limitation.

A method for determining the duration of the dummy irradiation will now be described. First, information about the relationship between the duration of the dummy irradiation on the projection optical system 107 and the amount of change in the astigmatism of the projection optical system 107 is obtained in advance. Next, a coefficient of proportionality (Coef) indicating the amount of change in the astigmatism of the projection optical system 107 per unit time is determined based on the obtained information. The coefficient of proportionality (Coef) is a second coefficient. The duration of the dummy irradiation (irradiation time) is then determined based on Eq. (4):

$$T = Coef \times AS, \qquad \text{Eq. (4)}$$

where T is the duration of the dummy irradiation, and AS is the amount of astigmatism to be changed in adjusting the astigmatism of the projection optical system 107 to a desired value (desired value of the astigmatism).

While, in the present exemplary embodiment, the amount of astigmatism to be changed is adjusted by adjusting the duration of the dummy irradiation, an amount of dummy irradiation may be used instead of the duration of the dummy irradiation.

Figure 7:
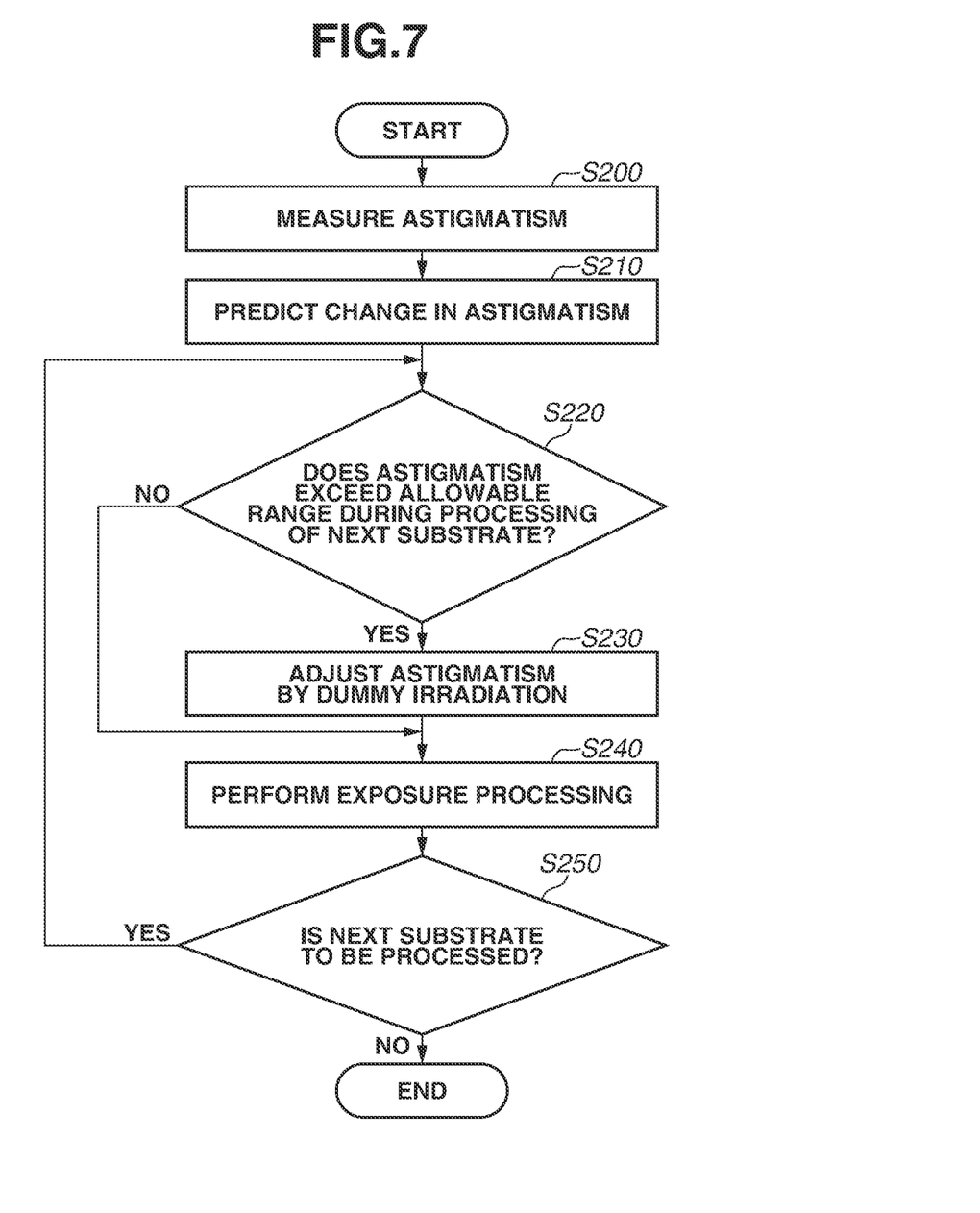
FIG. 7 is a flowchart in performing dummy irradiation to correct astigmatism according to the first exemplary embodiment.

FIG. 7 is a flowchart of performing the dummy irradiation to correct astigmatism according to the present exemplary embodiment. First, in step S200, the control unit 120 measures astigmatism using the effective light source distribution for exposure processing. The astigmatism measurement in step S200 is intended to check the state of astigmatism before a start of exposure, and does not need to be performed if the value of the astigmatism before the start of exposure is known in advance. In step S210, the control unit 120 predicts a change in the astigmatism during the exposure processing based on the measurement of the astigmatism and the aberration saturation P stored in association with the exposure condition stored in the storage unit 130 (prediction process). In the prediction process, for example, the astigmatism in performing the exposure processing on a plurality of substrates included in a lot is predicted. In step S210, the astigmatism is predicted using Eqs. (1), (2), and (3). In step S220, based on a result of the prediction made in the prediction process of step S210, the control unit 120 determines whether the astigmatism exceeds an allowable range (predetermined range) during processing of the next substrate (determination process).

In the present exemplary embodiment, an example is described where a change in the astigmatism (optical characteristic) will be predicted by predicting a change in the optical characteristic from a start to an end of the exposure process so that a change in the optical characteristic due to an adjustment made to the optical characteristic in the adjustment process is also included. More specifically, for example, in an exposure process of exposing 25 substrates included in a lot, in a case where the optical characteristic exceeds the allowable range during the exposure of the ninth substrate, the optical characteristic is adjusted before the exposure of the ninth substrate is started. If the optical characteristic (astigmatism) is scheduled to be adjusted to a target value in nanometers (nm) of zero (0) (nm) before the exposure of the ninth substrate is started, in the prediction process, a change in the optical characteristic in exposing the ninth and subsequent substrates is predicted on an assumption that the optical characteristic is adjusted to 0 (nm) before the exposure of the ninth substrate is started. Before the start of the exposure process, a change in the optical characteristic from the start to the end of the exposure processing of the plurality of substrates included in a lot is predicted so that a change in the optical characteristic due to the adjustment process to be performed during the exposure process is also included. In the determination process and the adjustment process, determinations are made and the optical characteristic is adjusted based on the prediction. In such a manner, the prediction can be completed at one time before the start of the exposure process. However, the prediction process may be performed each time after the adjustment process.

In such a case, the second information, or the initial value for predicting the optical characteristic, may be obtained by measurement. This makes the result of the prediction in the prediction process more accurate.

The storage unit 130 stores a plurality of exposure processing conditions each in association with the first information including the aberration saturation P (first coefficient). The control unit 120 selects the same exposure processing condition as that when the astigmatism is measured from those stored in the storage unit 130, and predicts a change in the astigmatism (optical characteristic) using the aberration saturation P associated with the selected exposure processing condition. The allowable range (predetermined range) is set by the user for each exposure processing condition in advance based on an effect of aberration and desired precision of the exposure processing.

If the astigmatism does not exceed the allowable range during the processing of the next substrate (NO in step S220), the processing proceeds to step S240. In step S240, the control unit 120 performs the exposure processing (exposure process). If the astigmatism exceeds the allowable range during the processing of the next substrate (YES in step S220), the processing proceeds to step S230. In step S230, the control unit 120 retracts the reticle 104 and adjusts the astigmatism by dummy irradiation (adjustment process). The effective light source distribution used for the dummy irradiation in step S230 is switched so that the astigmatism is adjusted to a desired value by the dummy irradiation. By the dummy irradiation in step S230, the astigmatism (optical characteristic) is adjusted to 0 (nm), for example.

In step S240, after the adjustment of the astigmatism in step S230, the reticle 104 that has been retracted is moved to a position where the exposure processing can be performed, and the exposure processing is performed with the diffraction optical element 103 switched to the effective light source distribution for the exposure processing (exposure process). In the present exemplary embodiment, the adjustment process is performed at least once or more during the exposure process, and at least part of the exposure process is performed after the adjustment process. The at least part of the exposure process refers to, for example, exposure of at least one or more of the plurality of substrates on which the exposure processing is to be performed in the exposure process. For example, in a case where the exposure process is a process from a start to an end of exposure of 25 substrates included in a lot, and the adjustment process is performed before the exposure of the ninth substrate, the ninth substrate is exposed after the adjustment process. The substrates included in the lot are then exposed in succession as long as the astigmatism is not determined to exceed the allowable range in the determination process based on the result of the prediction of the prediction process. The adjustment process can be performed once or more in a lot, and the number of times thereof is not limited in particular.

The exposure process does not necessarily need to be performed every time after the adjustment process, and at least part of the exposure process is to be performed after at least one adjustment process. In step S250, after the exposure processing of step S240, the control unit 120 determines whether to process the next substrate. If the next substrate is to be processed (YES in step S250), the processing returns to step S220. If not (NO in step S250), the processing ends. The determination of step S250 is synonymous with determining whether the exposure processing has been performed up to the last of the plurality of substrates included in a lot. In the case where step S230 is performed and then the processing goes through steps S240 and S250 and returns to step S220, the prediction of step S220 may be made based on the target value of the astigmatism adjusted in step S230 and the amount of change in the astigmatism predicted to occur after the adjustment. For example, in a case where the astigmatism is adjusted to 0 (nm) in step S230, and the amount of change in the astigmatism after the adjustment of the astigmatism to 0 (nm) is predicted to be 5 (nm), the determination is made as to whether the astigmatism exceeds the allowable range if the exposure processing is performed on the next substrate in the state where the astigmatism is 5 (nm). In other words, the prediction is made based on astigmatism information determined from the target value of adjustment of the astigmatism and the amount of change in the astigmatism predicted to occur after the adjustment. Alternatively, the prediction may be made after the astigmatism is adjusted and before the astigmatism changes. In such a case, the amount of change in the astigmatism that occurs after the adjustment of the astigmatism does not need to be calculated.

In the present exemplary embodiment, whether to perform the dummy irradiation (adjust the optical characteristic) is determined by determining whether the astigmatism exceeds the allowable range during the processing of the next substrate. However, a threshold may be set instead of the allowable range (predetermined range), and whether to perform the dummy irradiation may be determined by comparing the measurement of the astigmatism with the threshold.

In the determination process according to the present exemplary embodiment, whether to perform the dummy irradiation is determined by determining whether the astigmatism exceeds the allowable range during the exposure processing of the next substrate. However, step S220 does not need to be performed substrate by substrate. The determination process may be performed once in a predetermined number of substrates, such as every two substrates. Alternatively, based on the result of the prediction of the astigmatism, whether the astigmatism exceeds the allowable range may be determined on a substrate where the astigmatism is predicted to exceed the allowable range (predetermined range) or a substrate prior to the substrate where the astigmatism is predicted to exceed the allowable range (predetermined range). The substrate prior to the substrate where the astigmatism is predicted to exceed the allowable range (predetermined range) refers to, for example, the substrate to be exposed before (immediately before) the exposure of the substrate where the astigmatism is predicted to exceed the allowable range (predetermined range). In other words, the determination process is to determine whether the optical characteristic (astigmatism) exceeds the predetermined range during the exposure process (from a start to an end of exposure of the plurality of substrates included in a lot). The determination timing can be freely set by the user.

In the present exemplary embodiment, an example is described where the astigmatism (optical characteristic) is adjusted to 0 (nm) by the dummy irradiation. However, the astigmatism may be adjusted to an offset value instead of 0 (nm). Adjusting the astigmatism (optical characteristic) to 0 (nm) means that the optical characteristic is adjusted so that resolution performance at the time of exposure immediately after the adjustment process is higher than or equal to predetermined performance. The optical characteristic is desirably adjusted so that the resolution performance at the time of exposure immediately after the adjustment process is highest. Adjusting the astigmatism (optical characteristic) to an offset value means that the optical characteristic is adjusted to a value offset from that of the optical characteristic where the resolution performance at the time of exposure immediately after the adjustment process is highest. Offsetting the value in a direction different from a direction of change in the optical characteristic can sometimes reduce the number of times the adjustment process is performed.

In the present exemplary embodiment, whether the astigmatism exceeds the allowable range during the exposure processing of the next substrate is determined. However, a range may be set with regard to the allowable range, and dummy irradiation may be performed if the astigmatism falls within the range. More specifically, a range including at least either an upper limit value or a lower limit value of the allowable range (predetermined range) is set with regard to the upper or lower limit value, and the optical characteristic is determined to be adjusted in the determination process if the value of the optical characteristic predicted in the prediction process falls within the range including the upper or lower limit value. The adjustment process for adjusting the optical characteristic is performed based on a result of the determination. Suppose, for example, that the upper limit value of the allowable range of the astigmatism is 30 (nm) and a range of 5% is set. In such a case, dummy irradiation may be performed if the astigmatism during the exposure processing of the next substrate reaches or exceeds 28.5 (nm).

The present exemplary embodiment can predict the amount of aberration that occurs during the exposure processing and adjust the aberration (perform dummy irradiation) before the amount of aberration occurred exceeds the allowable range. Predicting the amount of aberration that occurs based on the prediction equations and the measurements eliminates the need to measure the aberration as appropriate, and can also reduce the time of aberration measurement. Predicting the amount of aberration that occurs also enables adjustment of the aberration based on the prediction immediately before the allowable range is exceeded, and can minimize the number of aberration adjustments as compared to the case of measuring and adjusting the aberration as appropriate. Minimizing the number of aberration adjustments can reduce the time for the exposure processing.

Figure 8:
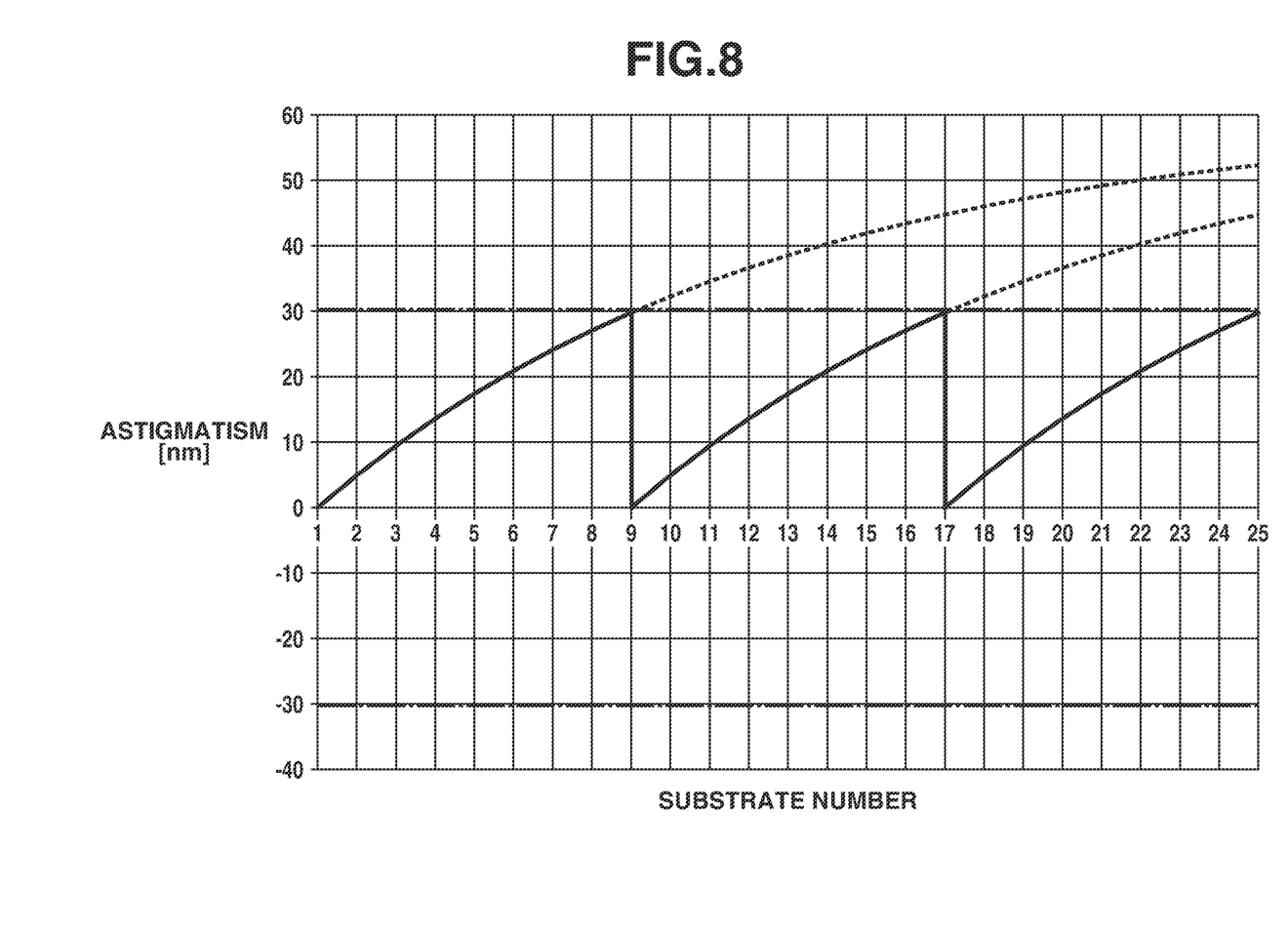
FIG. 8 illustrates an example of astigmatism adjustment according to the first exemplary embodiment.

FIG. 8 illustrates an example of astigmatism adjustments according to the present exemplary embodiment. In the example of FIG. 8, the exposure processing is performed on 25 substrates included in a lot. As the upper and lower limit values are indicated by the dot-dashed lines, the allowable range of the astigmatism is −30 (nm) to +30 (nm). The exposure processing according to the present exemplary embodiment is defined so that non-exposure periods for movement between shots and non-exposure periods for wafer (substrate) replacement are also included. Specifically, in the example of FIG. 8, a period from the start of exposure of the first substrate among the substrates included in a lot to the end of exposure of the last substrate is defined as being in the exposure processing (exposure processing period). In other words, the exposure process where the exposure processing is performed between a start and an end of the exposure processing on the plurality of substrates included in a lot is referred to as being in the exposure processing (exposure processing period). The prediction results of the astigmatism are illustrated by dotted lines. Without astigmatism adjustment, the astigmatism exceeds the allowable range during the exposure of the ninth substrate. In such a case, exposure processing results of the ninth and subsequent substrates are greatly affected by the astigmatism. Dummy irradiation is thus performed to adjust the astigmatism (optical characteristic) before a start of exposure of the ninth substrate. The ninth substrate is then exposed, and whether the astigmatism exceeds the allowable range is determined at the tenth and subsequent substrates. As with the ninth substrate, the astigmatism is also predicted to exceed the allowable range during the exposure of the seventeenth substrate. The astigmatism is thus adjusted before a start of exposure of the seventeenth substrate.

In such a manner, in the present exemplary embodiment, whether the astigmatism (optical characteristic) exceeds the allowable range during the exposure processing of the next substrate is determined based on the second information that is information about the initial value for predicting astigmatism, the aberration saturation P, and Eqs. (1), (2), and (3). If the astigmatism is predicted to exceed the allowable range, the astigmatism is adjusted. The astigmatism can thereby be prevented from exceeding the allowable range during the exposure processing of a plurality of substrates included in a lot. In the present exemplary embodiment, the example is described of adjusting the astigmatism. However, the optical characteristic to be adjusted may be any optical characteristic that changes due to irradiation of the projection optical system with light, and is not limited to the astigmatism. Examples of the optical characteristic to be adjusted according to the present exemplary embodiment include spherical aberration, coma aberration, field curvature, and distortion aberration (distortion).

A second exemplary embodiment is characterized in manufacturing an article using the exposure apparatus (exposure method) according to the first exemplary embodiment.

Figure 9:
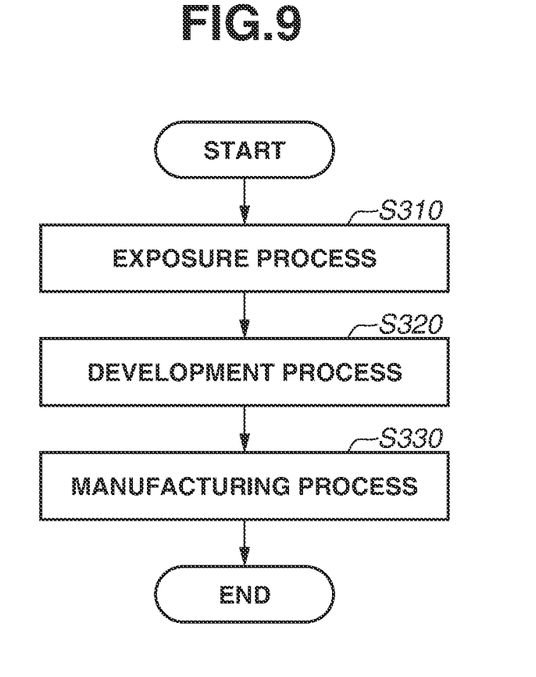
FIG. 9 is a flowchart of a method for manufacturing an article according to a second exemplary embodiment.

FIG. 9 is a flowchart of a method for manufacturing an article according to the present exemplary embodiment. In step S310, an exposure process of adjusting an optical characteristic (astigmatism) and performing exposure using the exposure apparatus (exposure method) according to the first exemplary embodiment is performed. In step S320, a development process of developing a photosensitive material patterned by the exposure in the exposure process on the substrate is performed. In step S330, a manufacturing process of manufacturing an article with the substrate developed in the development process is performed.

Examples of the article to be manufactured by the manufacturing method include a semiconductor integrated circuit (IC) element, a liquid crystal display element, a color filter, and microelectromechanical systems (MEMS).

In the exposure process, for example, a substrate (such as a silicon substrate and a glass substrate) on which a photosensitive material is applied is patterned by exposing the substrate using the exposure apparatus (lithography apparatus).

The manufacturing process includes, for example, etching of the substrate developed in the development process, resist removing, dicing, bonding, and packaging. According to the manufacturing method, an article of higher quality than heretofore can be manufactured.

The disclosure of this specification includes various exemplary embodiments and the following exposure method, exposure apparatus, and method for manufacturing an article.

[Item 1]

According to some embodiments, an exposure method can include:
- performing exposure processing via a projection optical system between a start and an end of the exposure processing on a plurality of substrates included in a lot as exposure;
- predicting a change in an optical characteristic of the projection optical system during the exposure based on an exposure processing condition of the exposure;
- determining whether the optical characteristic exceeds a predetermined range during the exposure based on a predicted result; and
- if the optical characteristic is determined to exceed the predetermined range during the exposure, irradiating the optical characteristic with light and adjusting the optical characteristic before the optical characteristic exceeds the predetermined range, wherein at least one or more of the plurality of substrates is/are exposed after the adjusting.

[Item 2]

The exposure method according to some embodiments can include Item 1, wherein the optical characteristic is adjusted a plurality of times during the exposure.

[Item 3]

The exposure method according to some embodiments can include Item 1 or 2, wherein the change in the optical characteristic is predicted based on first information and second information, the first information being information for predicting the change in the optical characteristic during the exposure, and the second information being information about an initial value for predicting the change in the optical characteristic.

[Item 4]

The exposure method according to some embodiments can include Item 3, wherein the second information is information obtained by measuring the optical characteristic.

[Item 5]

The exposure method according to some embodiments can include Item 3, wherein the second information is a target value of adjustment of the optical characteristic.

[Item 6]

The exposure method according to some embodiments can include Item 3, wherein the second information is a value obtained based on a target value of adjustment of the optical characteristic and an amount of change in the optical characteristic predicted to occur after the adjusting.

[Item 7]

The exposure method according to some embodiments can include any one of Items 1 to 6, wherein a change in the optical characteristic between a start and an end of the exposure is predicted so that the change in the optical characteristic includes a change in the optical characteristic due to the adjusting of the optical characteristic.

[Item 8]

The exposure method according to some embodiments can include any one of Items 1 to 6, wherein the change in the optical characteristic is predicted each time after the adjusting.

[Item 9]

The exposure method according to some embodiments can include any one of Items 1 to 8, wherein the predetermined range is set for each exposure processing condition.

[Item 10]

The exposure method according to some embodiments can include any one of Items 1 to 9, wherein the optical characteristic is adjusted so that resolution performance in performing the exposure processing is higher than or equal to predetermined performance.

[Item 11]

The exposure method according to some embodiments can include any one of Items 1 to 10, wherein the optical characteristic is adjusted to a value offset from a value of the optical characteristic at which resolution performance in performing the exposure processing is maximized.

[Item 12]

The exposure method according to some embodiments can include any one of Items 1 to 11, wherein the determining is performed on every predetermined number of substrates, on a substrate at which optical characteristic is predicted to exceed the predetermined range, or on a substrate immediately prior to the substrate at which the optical characteristic is predicted to exceed the predetermined range.

[Item 13]

The exposure method according to some embodiments can include any one of Items 1 to 12, wherein the optical characteristic is astigmatism of the projection optical system.

[Item 14]

The exposure method according to some embodiments can include any one of Items 3 to 13, wherein the first information includes information about a first coefficient indicating aberration saturation included in a prediction equation used in the predicting.

[Item 15]

The exposure method according to some embodiments can include any one of Items 1 to 14, wherein the optical characteristic is adjusted by the irradiating with the light for a time determined based on a second coefficient indicating an amount of change in the optical characteristic per unit time.

[Item 16]

The exposure method according to some embodiments can include any one of Items 1 to 15, wherein the irradiating with the light illuminates the projection optical system and not the substrate.

[Item 17]

The exposure method according to some embodiments can include any one of Items 1 to 16, wherein the optical characteristic is adjusted when a patterned master is located at a position to not be illuminated with the light.

[Item 18]

The exposure method according to some embodiments can include any one of Items 3 to 17, wherein the first information is stored in association with the exposure processing condition, and if the exposure processing is performed under a same condition as the exposure processing condition, the optical characteristic is predicted using the first information.

[Item 19]

The exposure method according to some embodiments can include Items 1 to 18, wherein a light intensity distribution on a pupil plane of an illumination optical system during the irradiating with the light is switched based on the predicted result.

[Item 20]

The exposure method according to some embodiments can include any one of Items 1 to 19, wherein a range including at least either an upper limit value or a lower limit value of the predetermined range is set with regard to the upper or lower limit value, and if a value of the predicted optical characteristic is in the range including the upper or lower limit value, the optical characteristic is adjusted.

[Item 21]

According to some embodiments, an exposure apparatus can include:

a projection optical system configured to project light;

a control unit configured to predict a change in an optical characteristic of the projection optical system and control adjustment of the optical characteristic; and a storage unit configured to store previously obtained information for predicting the change in the optical characteristic, wherein the control unit is configured to predict the change in the optical characteristic in performing exposure processing between a start and an end of the exposure processing on a plurality of substrates included in a lot based on the information stored in the storage unit and information about an initial value of the optical characteristic, determine whether the predicted optical characteristic exceeds a predetermined range during the exposure processing, if the optical characteristic exceeds the predetermined range during the exposure processing, control the adjustment of the optical characteristic before the optical characteristic exceeds the predetermined range, and control exposure of at least one or more of the plurality of substrates after the adjustment of the optical characteristic.

[Item 22]

According to some embodiments, a method for manufacturing an article can include:

adjusting an optical characteristic and exposing a substrate using the exposure method according to any one of Items 1 to 20;

developing a photosensitive material patterned on the substrate by exposure in the exposing; and manufacturing the article with the developed substrate.

The present disclosure is not limited to the foregoing exemplary embodiments, and various changes and modifications can be made without departing from the spirit and scope of the disclosure. The claims are therefore appended to make the scope of the disclosure public.

According to some exemplary embodiments of the present disclosure, exposure processing can be performed with a reduced effect of aberration.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2022-174673, filed Oct. 31, 2022, which is hereby incorporated by reference herein in its entirety.

What is claimed is:

1. An exposure method comprising:

performing exposure processing via a projection optical system during exposure on a plurality of substrates included in a lot;

predicting a change in an optical characteristic of the projection optical system during the exposure based on an exposure processing condition;

determining whether the optical characteristic exceeds a predetermined range during the exposure based on the change in the optical characteristic; and adjusting the optical characteristic by irradiating the projection optical system with light before the optical characteristic exceeds the predetermined range, in a case where the optical characteristic is determined to exceed the predetermined range during the exposure, wherein at least one of the plurality of substrates is/are exposed after the adjusting, and wherein in the irradiation with the light for the adjustment of the optical characteristic the light is applied to the projection optical system without being applied to the substrate.

2. The exposure method according to claim 1, wherein the optical characteristic is adjusted when a patterned master is located at a position to not be illuminated with the light.

3. The exposure method according to claim 1, wherein a light intensity distribution on a pupil plane of an illumination optical system during the irradiating with the light is switched based on the change in the optical characteristic.

4. The exposure method according to claim 1, wherein the optical characteristic is adjusted a plurality of times during the exposure.

5. The exposure method according to claim 1, wherein the change in the optical characteristic is predicted based on first information and second information, the first information being information for predicting the change in the optical characteristic during the exposure, and the second information being information about an initial value for predicting the change in the optical characteristic.

6. The exposure method according to claim 5, wherein the second information is information obtained by measuring the optical characteristic.

7. The exposure method according to claim 5, wherein the second information is a target value of adjustment of the optical characteristic.

8. The exposure method according to claim 5, wherein the second information is a value obtained based on a target value of adjustment of the optical characteristic and an amount of change in the optical characteristic predicted to occur after the adjusting.

9. The exposure method according to claim 5, wherein the first information includes information about a first coefficient indicating aberration saturation included in a prediction equation used in the predicting.

10. The exposure method according to claim 5, wherein the first information is stored in association with the exposure processing condition, and in a case where the exposure processing is performed under a same condition as the exposure processing condition, the optical characteristic is predicted using the first information.

11. The exposure method according to claim 1, wherein the change in the optical characteristic is predicted each time after the adjusting.

12. The exposure method according to claim 1, wherein the optical characteristic is adjusted to a value offset from a value of the optical characteristic at which resolution performance in performing the exposure processing is maximized.

13. The exposure method according to claim 1, wherein the determining is performed on every predetermined number of substrates, on a substrate at which optical characteristic is predicted to exceed the predetermined range, or on a substrate immediately prior to the substrate at which the optical characteristic is predicted to exceed the predetermined range.

14. The exposure method according to claim 1, wherein the optical characteristic is astigmatism of the projection optical system.

15. The exposure method according to claim 1, wherein a range including at least either an upper limit value or a lower limit value of the predetermined range is set with regard to the upper or lower limit value, and in a case where a value of the predicted optical characteristic is in the range including the upper or lower limit value, the optical characteristic is adjusted.

16. An exposure apparatus comprising:
a projection optical system configured to project light;
a control unit configured to predict a change in an optical characteristic of the projection optical system and control adjustment of the optical characteristic; and
wherein the control unit is configured to
predict the change in the optical characteristic in performing exposure processing during exposure on a plurality of substrates included in a lot based on an exposure processing condition,
determine whether the predicted optical characteristic exceeds a predetermined range during the exposure,
control the adjustment of the optical characteristic by irradiating the projection optical system with light before the optical characteristic exceeds the predetermined range, in a case where the optical characteristic exceeds the predetermined range during the exposure processing, and
control exposure of at least one of the plurality of substrates after the adjustment of the optical characteristic,
wherein in the irradiation with the light for the adjustment of the optical characteristic the light is applied to the projection optical system without being applied to the substrate.

17. A method for manufacturing an article, the method comprising:
adjusting an optical characteristic and exposing a substrate using the exposure method according to claim 1;
developing a photosensitive material patterned on the substrate by exposure in the exposing; and
manufacturing the article with the developed substrate.

* * * * *